United States Patent
Morizuka

(10) Patent No.: US 6,448,859 B2
(45) Date of Patent: Sep. 10, 2002

(54) HIGH FREQUENCY POWER AMPLIFIER HAVING A BIPOLAR TRANSISTOR

(75) Inventor: Kouhei Morizuka, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,149

(22) Filed: Mar. 27, 2001

(30) Foreign Application Priority Data

Mar. 28, 2000 (JP) ........................................ 2000-089060

(51) Int. Cl.[7] ................................................. H03F 3/68
(52) U.S. Cl. ........................................ 330/295; 330/296
(58) Field of Search ................................ 330/295, 296, 330/124 R

(56) References Cited

U.S. PATENT DOCUMENTS

| | | | |
|---|---|---|---|
| 5,321,279 A | | 6/1994 | Khatibzadeh et al. ........ 257/197 |
| 5,541,554 A | * | 7/1996 | Stengel et al. ............... 330/295 |
| 5,608,353 A | | 3/1997 | Pratt ............................ 330/295 |
| 5,629,648 A | | 5/1997 | Pratt ............................ 330/289 |
| 5,903,854 A | * | 5/1999 | Abe et al. .................... 330/295 |
| 6,052,032 A | * | 4/2000 | Jarvinen ...................... 330/296 |
| 6,236,266 B1 | * | 5/2001 | Choumei et al. ........... 330/296 |
| 6,317,002 B1 | * | 11/2001 | Griffiths ....................... 330/295 |

FOREIGN PATENT DOCUMENTS

JP                 8-274547           10/1996

* cited by examiner

*Primary Examiner*—Robert Pascal
*Assistant Examiner*—Khanh Van Nguyen
(74) *Attorney, Agent, or Firm*—Oblon, Spivak, McClelland, Maier & Neustadt, P.C.

(57) ABSTRACT

The object of the present invention is to provide a bipolar transistor which is excellent in uniformity of current distribution in spite of a small ballast resistance, and can constitute an amplifier showing high efficiency and low distortion with little deterioration of distortion even when a digital modulation wave is input thereto. A high frequency power amplifier of the present invention comprises a plurality of transistor blocks having a bipolar transistor, wherein each of the transistor blocks includes a resistance connected to an emitter of the bipolar transistor, a reference voltage generation circuit for generating a reference voltage as a base bias of the bipolar transistor, and a bias generation circuit connected to a base of the bipolar transistor, the bias generation circuit generating a base bias voltage by converting the reference voltage.

18 Claims, 13 Drawing Sheets

| BALLAST RESISTANCE (Ω) | POWER EFFICIENCY OF PRESENT INVENTION | POWER EFFICIENCY OF CONVENTIONAL EXAMPLE |
|---|---|---|
| 3.5 | 38% | 35% |
| 2.0 | 43% | 27% | ns
HIGH FREQUENCY POWER AMPLIFIER HAVING A BIPOLAR TRANSISTOR

CROSS REFERENCE TO RELATED APPLICATIONS

This application claims benefits of priority under 35 U.S.C.119 to Japanese Patent Application No. P2000-89060 filed Mar. 28, 2000, the entire contents of which are incorporated by reference herein.

BACKGROUND OF THE INVENTION

1. Field of the Invention

The present invention relates to a high frequency power amplifier using a bipolar transistor, more particularly to a high frequency power amplifier having high efficiency and low distortion, which uses a heterojunction bipolar transistor.

2. Description of the Background

For recent mobile telephones and mobile information terminals, transistors efficiently performing power amplification at a frequency band of 1 GHz or more have become indispensable constituent components. Among these transistors, a heterojunction bipolar transistor formed on a gallium arsenide (hereinafter referred to as GaAs) substrate is excellent in a high frequency characteristic and operates at a low voltage with high efficiency. Accordingly, the heterojunction bipolar transistor meets social demands for reducing the number of cells to lighten the telephones and the terminals, and attracts social attention. In addition, the heterojunction bipolar transistor shows less three-dimensional distortion, and has a characteristic suitable for digital modulation for which high linearity of operation is required.

Although the heterojunction bipolar transistor using a material of the GaAs group has the principally excellent characteristic, this transistor sometimes makes its characteristic deteriorated when it is intended to obtain large output power. This originates from the fact that heat conductivity of the GaAs substrate is as comparatively low as about 0.4 W/K/cm (about ⅓ of silicon), and a rise of the device temperature becomes large with an elevation of an output level. When the bipolar transistor is driven while keeping the base-emitter voltage thereof constant, it has been known that a collector current increases due to the temperature rise. Accordingly, a positive feedback of a current increase, a power increase, a temperature rise and a current increase is produced, in which the current increase creates the consumption power to rise the device temperature, thus further increasing the current. There is a drawback that unevenness of current distribution occurs in the high frequency power amplifier having a plurality of emitter fingers and a large area, and a thermal runaway state may be brought about at the worst, resulting in breakdown of the transistor.

To cope with such a problem, the most familiar method from way back is a ballast resistance method (G. Gao et al. IEEE Trans. Electronic Dev., 1991, pp. 185–196) for providing a ballast resistance which increases either an emitter resistance or a base resistance to apply a negative feedback to a current increase and a voltage relation between a base and an emitter, thus canceling a positive feedback due to a temperature rise. An example of a high frequency power amplifier by heterojunction bipolar transistors, which use the ballast resistance method, is shown in FIG. 1, and a high frequency power amplifier using the conventional bipolar transistors will be described.

In FIG. 1, an output voltage of a reference voltage generation circuit 12 for generating a reference voltage as a base bias is distributed to bipolar transistors 1a, 1b, 1c and 1d serving as fingers of a transistor circuit 10 via a bias generation circuit 2 for performing an impedance conversion by a transistor 11. The reference voltage as the base bias is adjusted in accordance with the temperature of a diode 6. The bias circuit having such constitution shall be called a diode bias circuit in the following descriptions.

An emitter of each transistor 1a, 1b, 1c and 1d is connected to an earthed electrode via corresponding one of ballast resistances 5a, 5b, 5c and 5d. A high frequency power is connected to a base of each of the transistors 1a, 1b, 1c and 1d of the transistor circuit 10 via a metal insulator metal (hereinafter referred to as MIM) capacitor device 4. To prevent the high frequency power from leaking to the base bias circuit, a resistance 3 is connected between an emitter of the impedance conversion transistor 11 and the high frequency power transistor 1. Accordingly the bias generation circuit 2 shown in FIG. 1 comprises a bipolar transistor 11 for impedance conversion, a resistance 3 for blocking a high frequency, and a resistance FIG. 2 shows a pattern layout in a circuit constitution of the high frequency power amplifier using the conventional heterojunction bipolar transistor shown in FIG. 1. This pattern layout will be described in detail in the description of a first embodiment of the present invention while comparing with a pattern layout of a high frequency power amplifier as the first embodiment of the present invention. In the conventional power amplifier, 32 emitter fingers, each having a size of 4×30 μm, are arranged in a chip of 1 mm×2 mm as shown in FIG. 2, and a linear output of 30 dBmW is obtained. Here, reference numerals 1a, 1b, 1c and 1d denote transistors, each having eight emitter fingers connected in parallel. The bias circuit 2 composed of a diode bias circuit is arranged in the position shown in FIG. 2, and a DC potential is supplied to the base of each of the four transistor blocks 1a to 1d. The resistance 3 is provided for blocking the high frequency. A high frequency signal is connected to the base of each of the four transistor blocks 1a, 1b, 1c and 1d via the MIM capacitor 4.

So called a MMIC (Monolithic Microwave Integrated Circuit) is constituted by forming the transistor circuit having such constitution generally on a GaAs chip integratedly. In this circuit constitution, a change in temperature of the chip is detected by the diode 6, and a bias voltage in accordance with the temperature of the chip is supplied to the high frequency power transistor. However, when a high frequency power density becomes large, a temperature difference among the finger transistors of the high frequency power transistor circuit 10 occurs, thus making the current distribution uneven.

Particularly, temperature is apt to rise at the central portion of the high frequency transistor circuit 10, and in the example shown in FIG. 1, a sum of currents flowing in the finger transistors 1b and 1c is larger than that of currents flowing in the finger transistors 1a and 1d. In FIG. 3, the position of the transistor block in the conventional bipolar transistor circuit shown in FIG. 1 and the value of the collector current thereof are illustrated. As shown in FIG. 3, it is proved that the value of the collector current of the transistor positioned at the center of the bipolar transistor circuit varies more when the ballast resistance is 2 Ω than when the ballast resistance is 3.5 Ω.

Generally, when the ballast resistances 5a to 5d are made to be larger, a resistance to thermal runaway increases, and uniformity of the current distribution can be improved. However, when the ballast resistances are made to be too large, a drawback occurs in which a voltage of the transistor at a saturated region increases, thus deteriorating efficiency and lowering a gain.

Even if the ballast resistances 5a to 5d are made to be larger in the conventional bipolar transistor circuit shown in FIG. 1 and the resistance to the thermal runaway of the high output transistor 10 can be increased, resistance to breakdown of the bias circuit may be a problem. This means a problems that when a large amount of the collector current flows through the transistor circuit 10 compared to a normal use because of fluctuation of an external additional resistance connected to the collector of the high output transistor circuit 10, the transistor 11 of the base bias circuit 2 is broken.

Specifically, when the collector current increases by fluctuation of an external load of the transistor circuit 10, the base current of the transistor circuit 10 also increases. The base currents of all of the transistors 1a, 1b, 1c and 1d of the transistor circuit 10 flow through the transistor 11 of the bias circuit 2. When the values of the base currents become too large, the transistor 11 makes thermal runaway so that the transistor 11 may be broken.

Also in the constitution shown in FIG. 4, the output potential of the base bias reference voltage generation circuit 12 is distributed to the bases of first bipolar transistors 1a, 1b, 1c and 1d as fingers, which perform high frequency power amplification via a bias circuit generation circuit 2 performing an impedance conversion and ballast resistances 7a, 7b, 7c and 7d. The reference voltage generation circuit 12 comprises a diode 6, and the bias generation circuit 2 comprises a second bipolar transistor 11 and a resistance 9 provided between the transistor 11 for impedance conversion and the ground.

In the circuit of FIG. 4 having the above-described constitution, a high frequency power is supplied to the bases of the finger transistors 1a, 1b, 1c and 1d via MIM capacitor devices 8a, 8b, 8c and 8d without passing through ballast resistances. In this method, though the values of the ballast resistances are made to be large to assure uniform operations of the transistors, since the high frequency power is directly input to the base terminals of the transistors, the drawback of the deteriorated efficiency of the high frequency power amplifier and the lowered gain thereof due to a voltage increase of the transistor at the saturated region does not occur, which has been the problem also in the high frequency power amplifier of FIG. 1, and the characteristic of the high frequency power amplifier is improved.

However, a problem occurs in the case of, for example, a CDMA (Code Division Multiple Access) modulation method in which signals such as modulation signals having envelopes largely billowing are dealt with. To be specific, if the ballast resistances are large, a frequency component of the envelope is superposed on a voltage applied between the intrinsic base and emitter of the heterojunction bipolar transistor, and cross modulation with a carrier frequency component occurs, thus deteriorating distortion.

The collector current of the bipolar transistor, to which the signal of the digital modulation method is input, is schematically shown in FIG. 5. In the digital modulation method, amplitude of a high frequency current also changes depending on time. In the circuit of the second conventional high frequency power amplifier shown in FIG. 4, though the high frequency current does not flow through the base ballast resistances 7a, 7b, 7c and 7d, an envelope component of the modulation signal that is a low frequency component flows through the ballast resistances 7a, 7b, 7c and 7d. Therefore, the voltage applied between the intrinsic base and emitter of the heterojunction bipolar transistor having a large ballast resistance is modulated by the frequency component of the envelope.

As a result, in the base terminals of the bipolar transistors 1a, 1b, 1c and 1d, the two signals such as the original modulation signal and the envelope signal cause cross modulation, thus deteriorating distortion. Accordingly, from the viewpoints of suppressing the distortion component, there has been a problem that the ballast resistance cannot be made to be large immoderately, and an amplifier that can be applied to the one for use in digital modulation, for which demands have recently increased, cannot be constituted.

To solve the foregoing problems, a first object of the present invention is to provide a bipolar transistor having an excellent uniformity in a current distribution in spite of a small ballast resistance, and capable of constituting an amplifier showing high efficiency and low distortion with little deterioration of distortion even when a digital modulation wave is input thereto.

In the conventional bipolar transistor shown in FIG. 4, when a large collector current flows due to load fluctuation of a collector of the transistor circuit 10, a current flowing through the transistor 11 of the bias circuit 2 becomes large, and the transistor 11 may be broken. This problem holds true for the first conventional bipolar transistor circuit shown in FIG. 1.

SUMMARY OF THE INVENTION

The object of the present invention is to provide a bipolar transistor excellent in uniformity of current distribution in spite of a small ballast resistance, and capable of constituting an amplifier showing high efficiency and low distortion with little deterioration of distortion even when a digital modulation wave is input thereto.

To achieve the foregoing object, the present invention has the following features.

A first high frequency power amplifier shown in the present invention of this application comprises a plurality of transistor blocks having a bipolar transistor, wherein each of said transistor blocks further includes: a resistance connected to an emitter of said bipolar transistor; a reference voltage generation circuit for generating a reference voltage as a base bias to be applied to a base of said bipolar transistor; and a bias generation circuit for generating a base bias voltage by converting said reference voltage, the bias generation circuit being connected to the base of said bipolar transistor.

According to a first structure of the present invention of this application, it is possible to supply the base bias potential in accordance with a change in temperature to each of the transistor blocks.

Furthermore, a second high frequency amplifier shown in the present invention of this application comprises: a plurality of transistor blocks having a bipolar transistor; and a reference voltage generation circuit for generating a reference voltage of a base bias for said bipolar transistor, wherein each of said transistor blocks further includes: a resistance connected to an emitter of said bipolar transistor; a bias generation circuit for generating the base bias by converting said reference voltage, the bias generation circuit being connected to the base of said bipolar transistor; and a capacitor device for high frequency input, the capacitor device being connected to the base of said bipolar transistor.

According to a second structure of the present invention of this application, it is possible to supply the base bias potential in accordance with a change in temperature to each of the transistor blocks.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

For recent mobile telephones and mobile information terminals, transistors efficiently performing power amplification at a frequency band of 1 GHz or more have become indispensable constituent components. Among these transistors, a heterojunction bipolar transistor formed on a gallium arsenide (hereinafter referred to as GaAs) substrate is excellent in a high frequency characteristic and operates at a low voltage with high efficiency. Accordingly, the heterojunction bipolar transistor meets social demands for reducing the number of cells to lighten the telephones and the terminals, and attracts social attention. In addition, the heterojunction bipolar transistor shows less three-dimensional distortion, and has a characteristic suitable for digital modulation for which high linearity of operation is required.

Embodiments of a high frequency power amplifier using bipolar transistors according to the present invention will be described in detail with reference to the accompanying drawings. In describing the following embodiments, descriptions are made by referring to examples where the present invention is applied to a power amplifier of 2 GHz band using InGaP/GaAs heterojunction bipolar transistors.

Figure 6:
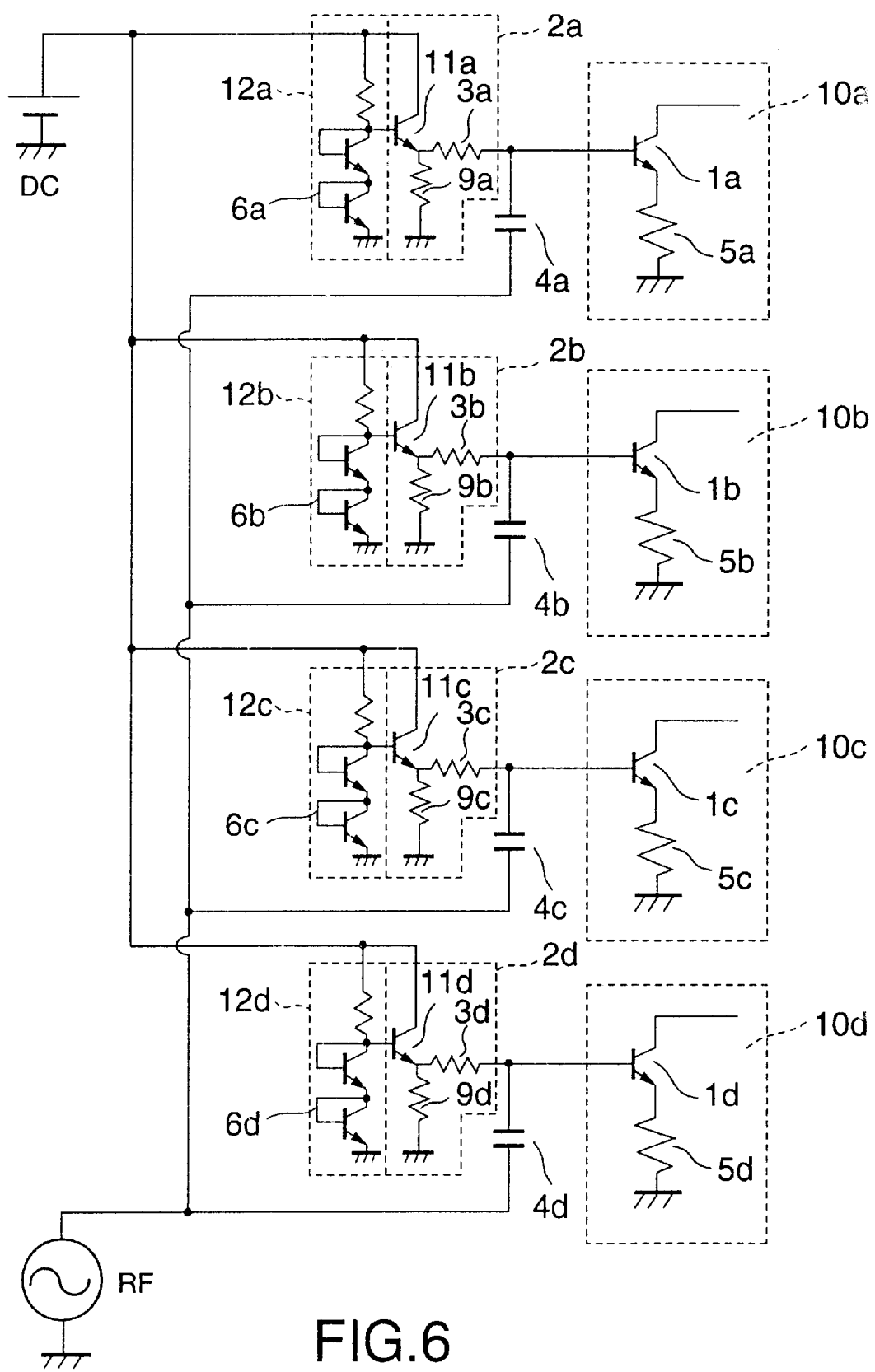
FIG. 6 is a circuit diagram showing a circuit of a high frequency power amplifier using bipolar transistors according to a first embodiment of the present invention.

A high frequency power amplifier using bipolar transistors according to a first embodiment of the present invention is constituted as shown in FIG. 6. For respective bases of finger transistors 1a, 1b, 1c and 1d serving as four output transistors, individual diode block bias circuits 2a, 2b, 2c and 2d are arranged closely to corresponding transistor blocks having bipolar transistors 1a, 1b, 1c and 1d. 1b be concrete, bipolar transistors 11a, 11b, 11c and 11d for impedance conversion, which constitute bias circuits 2a, 2b, 2c and 2d are connected to the bases of the bipolar transistors 1a, 1b, 1c and 1d via resistances 3a, 3b, 3c and 3d for blocking high frequency, respectively. Bias potentials are supplied to the respective bases of the finger bipolar transistors 1a, 1b, 1c and 1d.

A reference voltage for a base bias, which is generated by each of the respective reference voltage generation circuits 12a, 12b, 12c and 12d constituted of the diode circuits 6a, 6b, 6c and 6d, which are subjected to constant current biasing, is supplied to the base of each of the bipolar transistors 11a, 11b, 11c and 11d for impedance conversion, which constitute the bias circuits 2a, 2b, 2c and 2d. Each of resistances 9a, 9b, 9c and 9d is provided between the ground and corresponding one of the connection nodes of the emitters of the bipolar transistors 11a, 11b, 11c and 11d for the impedance conversion and the resistances 3a, 3b, 3c and 3d for blocking high frequency. For example, one bias circuit 2a is constituted of the bipolar transistor 11a, the resistance 3a for blocking high frequency and the resistance 9a.

In the transistor circuit of FIG. 6, there is provided means for solving a problem that both of a measure for a thermal runaway of bipolar transistor 1a to 1d and a measure for a thermal runaway of the transistor 11a to 11d of the bias generation circuit 2a to 2d. The former thermal runaway of bipolar transistor 10a to 10d means that when a constant input bias (base-emitter voltage) is applied, a collector current increases due to a temperature rise between the output current (collector current) and the device temperature, and the device temperature further rises due to the increase of the current, thus producing a positive feedback. This positive feedback elevates the device temperature of the central bipolar transistor, for example 1b, thus increasing the collector current of the central bipolar transistor. As the measure for these thermal runaways, the use of the ballast resistance is adopted. This is a method in which a resistance is in series connected to the emitter of each finger transistor, or a method in which a resistance is in series connected to the base of each finger transistor. By adopting these methods, a negative feedback is applied to a base-emitter input voltage and an output; voltage, and achieves a uniformity of a current quantity among the finger transistors in the device, thus achieving an increase in output power from the entire of the device. The resistance for applying the negative feedback is called a ballast resistance. In this application, the ballast resistances 5a to 5d are connected to the emitters of the respective bipolar transistors 1a to 1d of the transistor block. These ballast resistances serve so as to suppress the variation of the current among the transistor blocks.

However, it is impossible to constitute a high performance power amplifier when the variation of the current among the transistor blocks 10a to 10d is tried to be suppressed only by the method using the ballast resistance. Specifically, in the case where a temperature distribution among the transistor blocks 10a to 10d becomes large, values of the ballast resistances must also be made to be large. However, if the values of the ballast resistances are made to be too large, a problem that efficiency of the power amplifier decreases and an output power decreases occurs.

Figure 1:
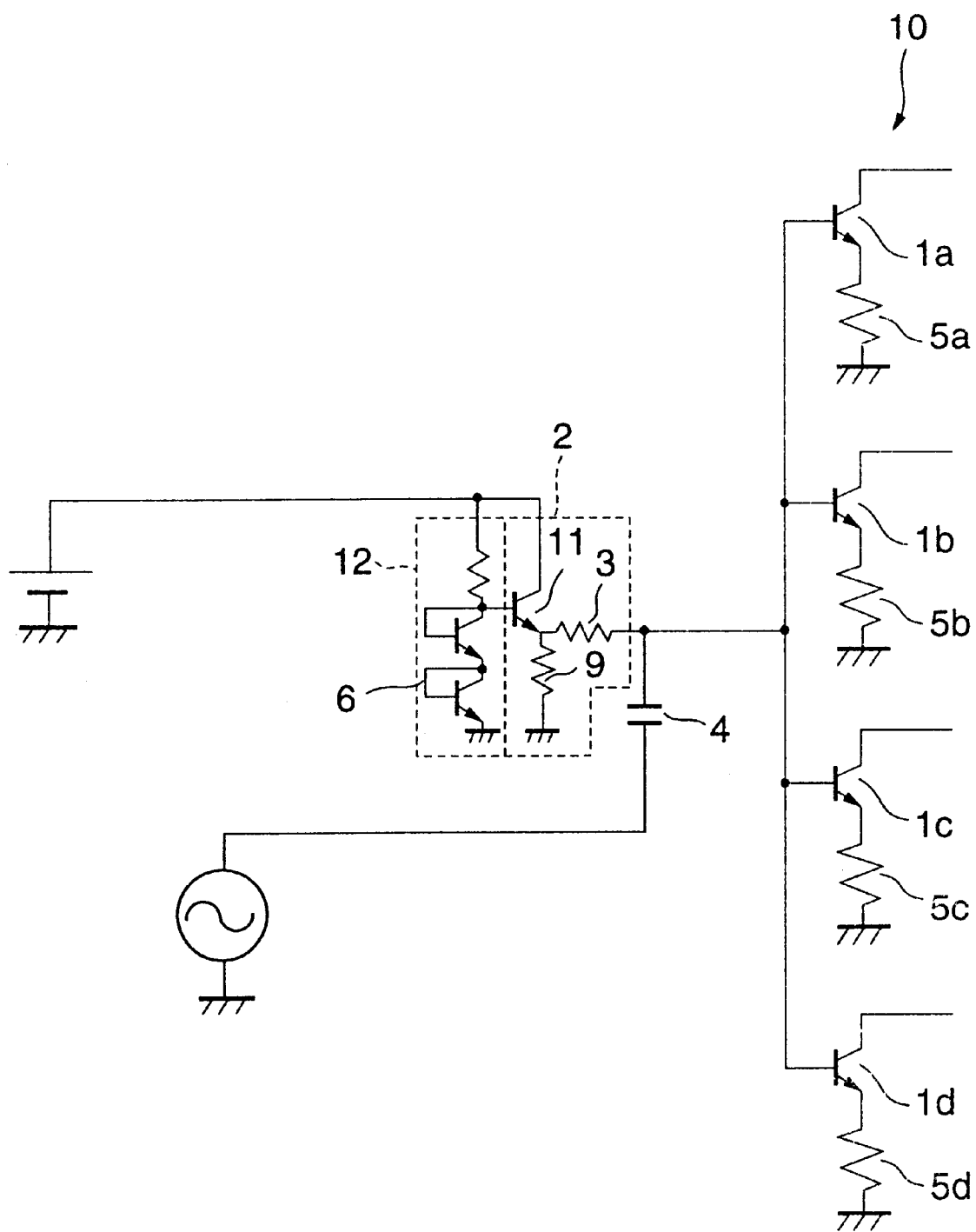
FIG. 1 is a circuit diagram showing a high frequency power amplifier using bipolar transistors according to a conventional first example.
Figure 2:
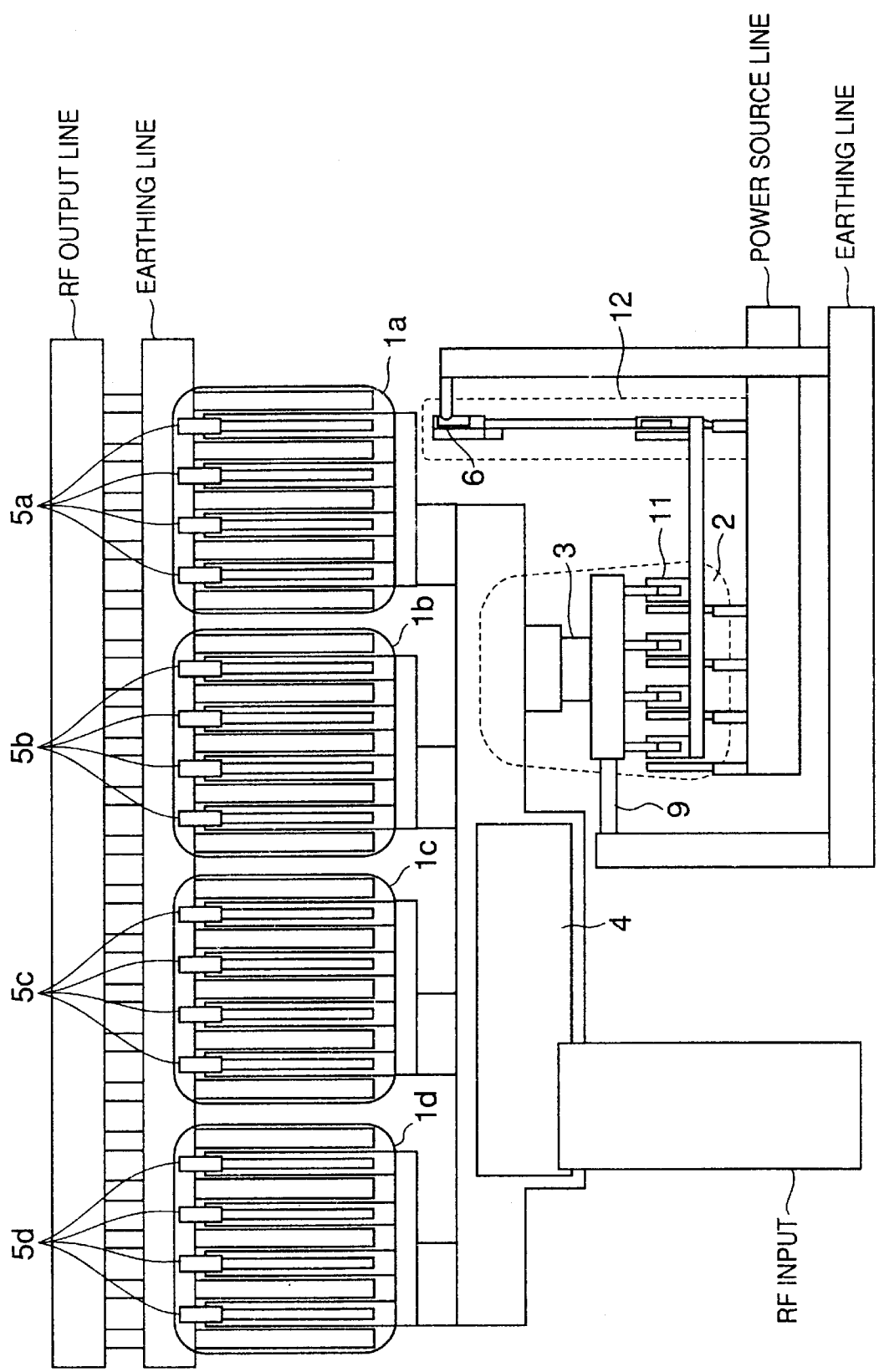
FIG. 2 is an explanatory view showing a pattern layout of the conventional high frequency power amplifier shown in FIG. 1.
Figure 3:
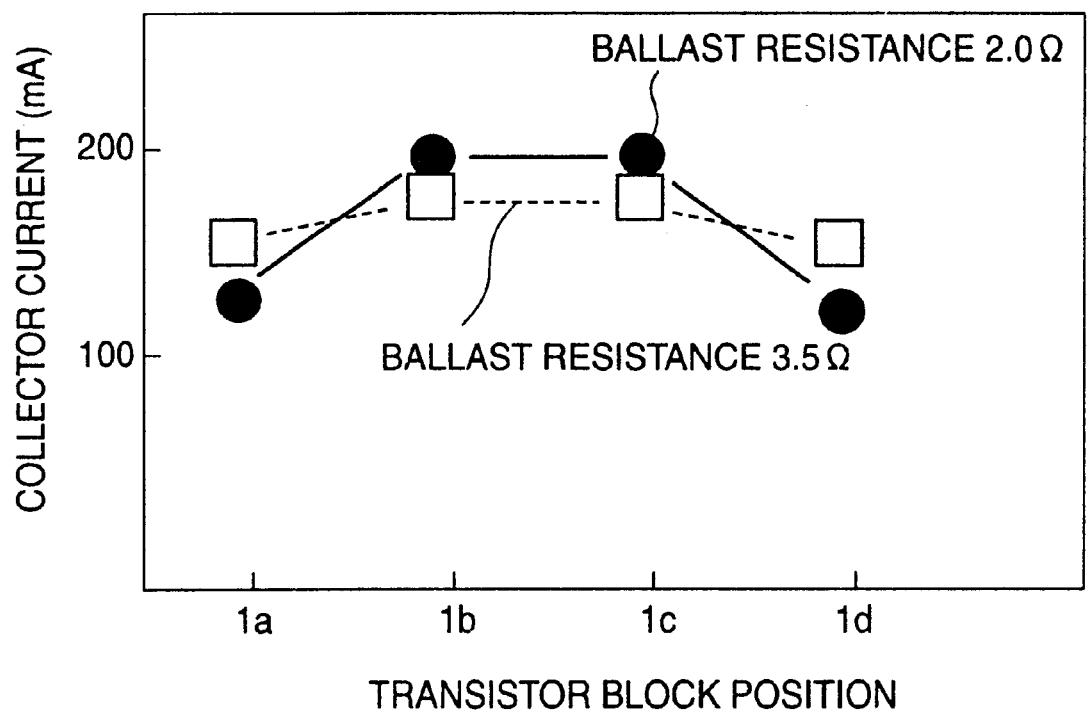
FIG. 3 is a characteristic view shown for comparing characteristics of bipolar transistors in the high frequency power amplifier of FIG. 1.

In FIG. 3, the current distribution flowing through each bipolar transistor in FIGS. 1 and 2 is shown by the use of an emitter resistance per finger (each of bipolar transistor) as a parameter. When the emitter resistance per finger is 3.5 Ω, the variation of the current is 15%, but the function of the ballast resistance grows weak with a decrease in the value of the emitter resistance to 2 Ω per finger, resulting in doubling the variation of the current to 30%.

Figure 7:
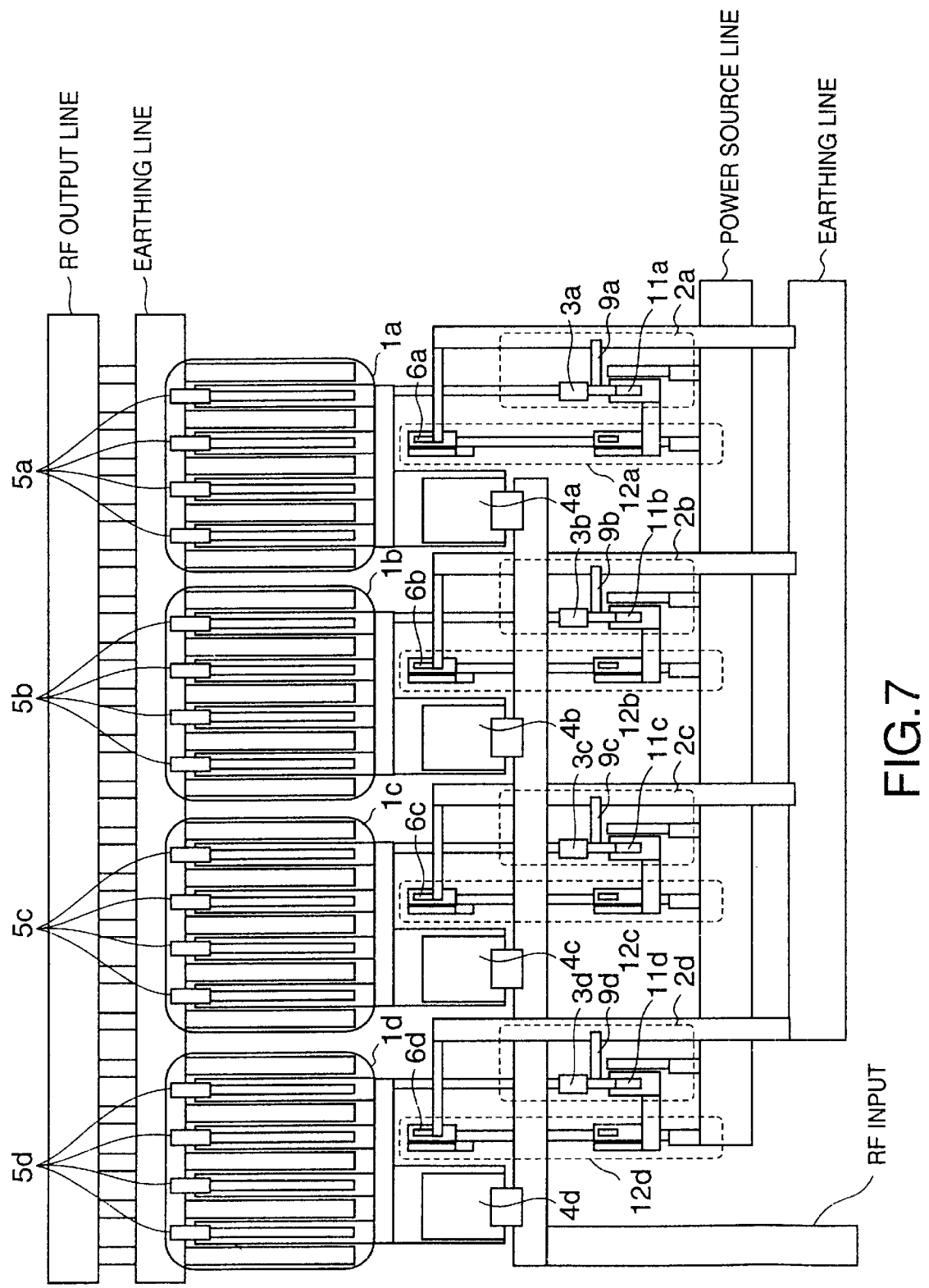
FIG. 7 is a plan view showing a pattern layout of the high frequency power amplifier according to the first embodiment of the present invention.

In the first embodiment of this application shown in FIG. 6, the base potential of each of the transistors 1a to 1d is applied by the corresponding one of the diode bias circuits 2a to 2d. The diode bias circuit 2a to 2d supplies a constant current to the diode-connected transistor 6a to 6d, and the base potential of this diode-connected transistor undergoes impedance conversion to be supplied to the base of each of the output transistors 1a, 1b, 1c and 1d. A change of an environment temperature is detected by the diode-connected transistor 6a to 6d, and a bias point is corrected so that the collector current of each of the output transistors 1a, 1b, 1c and 1d does not change. The first embodiment of this application has a particular IC pattern as shown in FIG. 7. Reference numerals in the pattern layout shown in FIG. 7 are the same as those of the constituent components shown in FIG. 6. The pattern layout has a feature that the transistors 6a to 6d shown in FIG. 7 are arranged closely to the corresponding transistors 1a to 1d of the transistor blocks 10a to 10d.

As shown in the pattern layout of FIG. 7 of this application, when the temperature sensing diodes 6a to 6d are arranged closely to the respective transistors 1a to 1d, it is possible to correct the bias point in accordance with the change of the device temperature of each high output transistor 1a to 1d. Specifically, when the device temperatures of the transistors rise, the device temperatures of the temperature sensing diodes 6a to 6d also rise, resulting in decreases in the bias voltages supplied to transistors 1a to 1d. This leads to a negative feedback action to a relation between the rise of the device temperature of each of the transistors 1a to 1d and the output collector current. Accordingly, this negative feedback can reduce the values of the ballast resistances 5a to 5b by the extent corresponding to the action. As a result, the problem of the decreases of the efficiency of the power amplifier and the output voltage in the prior art can be prevented.

Figures 9, 10:
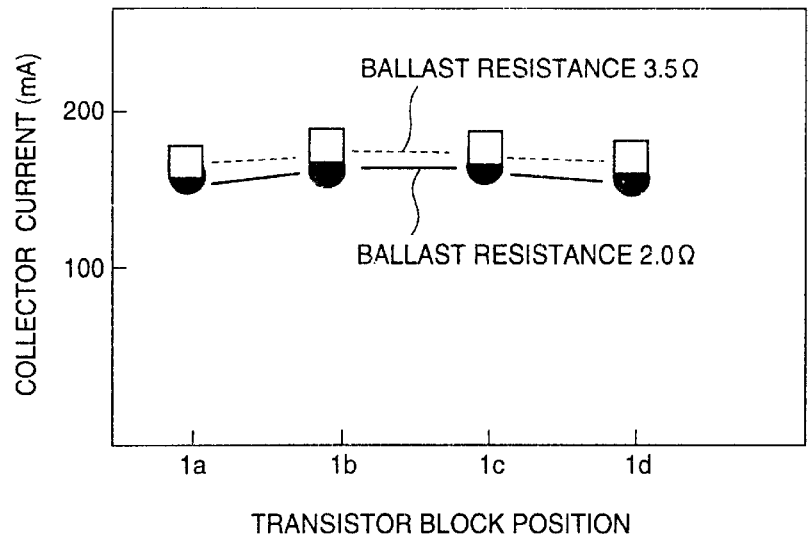
FIG. 9 is a characteristic view showing a characteristic of the high frequency power amplifier using the bipolar transistors according to the first embodiment of the present invention.
FIG. 10 is an explanatory view showing a table obtained by comparing an efficiency for a wide band CDMA signal of 2 GHz in the first embodiment with that in the conventional example.

In FIG. 9, a characteristic view of the high frequency power amplifier using the bipolar transistors according to the first embodiment of the present invention is shown. In FIG. 9, the current distribution flowing through each transistor blocks 10a, 10b, 10c and 10d having a structure according to this embodiment of the present invention is shown with using the emitter resistance per each transistor block 10a to 10d as a parameter. When the emitter resistance each transistor block 10a to 10d is 3.5 Ω, the variation of the current distribution is largely improved to 4%. Moreover, even in the case where the emitter resistance is set to be as small as 2 Ω, the variation of the current distribution can be controlled to 7%. FIG. 9 corresponds to FIG. 3, and according to FIG. 9, even when the ballast resistance is 2.0 Ω, significant deterioration can not be observed compared to the case where the ballast resistance is 3.5 Ω, and a preferable result can be obtained.

In mobile telephones adopting a digital modulation method, a B class amplifier or an AB class amplifier, for which a high efficiency operation is expected to lengthen a life of a cell, is used. In the B class amplifier or the AB class amplifier; consumption power changes depending on output power unlike in an A class amplifier. Accordingly, the device temperatures of the high output transistors 1a, 1b, 1c and 1d change in accordance with an output level.

Figure 8:
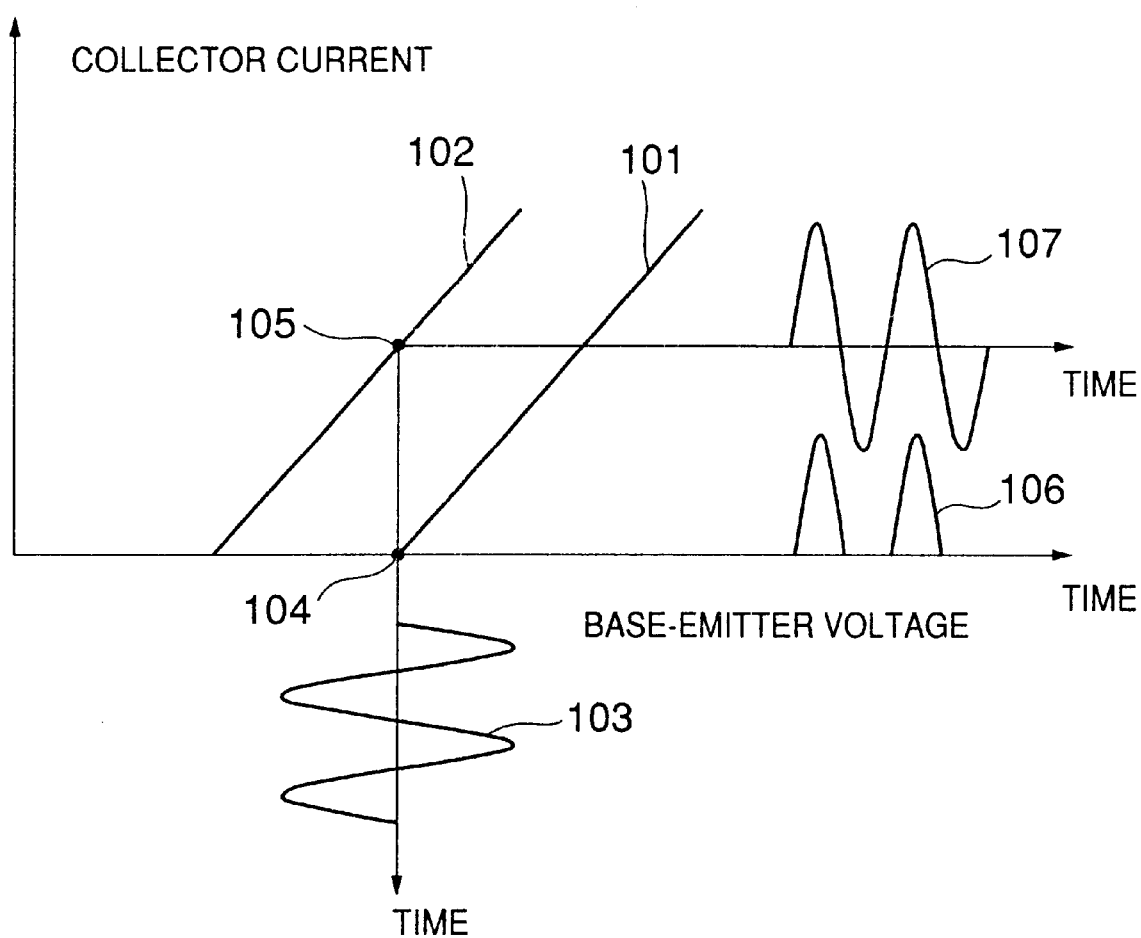
FIG. 8 is a view for explaining a change of temperature of an element of the conventional high frequency power amplifier as a compared object.

Therefore, when a constant bias voltage is applied to the high output transistors 1a, 1b, 1c and 1d, the output level increases to rise the device temperature, whereby efficiency deteriorates. A state at this time is shown in FIG. 8. Specifically, an input/output characteristic of the device is shown by reference numeral 101 when the device temperature is low. Even when the bias point 104 is set to the B class or the AB class, the input/output characteristic changes with a rise of the device temperature as the reference numeral 102 shows. Thus, the bias point shifts to the A class side, and the bias point is shown by reference numeral 105, leading to deterioration of power efficiency.

In the conventional bipolar transistors shown in FIG. 1 and FIG. 2, since a temperature rise in the transistor block on the center side of the chip is larger than that in the transistor block on the periphery side of the chip, a current has a tendency that it flows more through the transistor block in the central portion of the chip than the transistor block in the periphery portion of the chip, so that it is difficult to control the bias voltage precisely. For example, in FIG. 2, the temperature sensing diode 6 is arranged closely to the output transistor block 1a in the periphery portion of the chip. By this contrivance, the bias point is corrected on the basis of the device temperature of the transistor block 1a in the periphery portion of the chip. However, the characteristic is not improved than expected, because the correction of the bias point is performed on the basis of the device temperature of a part of the high output transistors. Specifically, in the arrangement as shown in FIG. 2, when the output level increases and the device temperature rises, the bias point of the blocks 1b and 1c in the central portions of the high output transistors shifts from either the B class side or AB class side to the A class side, leading to deterioration of power efficiency.

On the other hand, unlike FIG. 2, if the temperature sensing diode 6 is arranged closely to the block 1b on the central portion side of the high output transistor, when the output level increases and the device temperature rises, the bias point shifts to the C class side for the blocks 1a and 1d in the periphery portion of the high output transistors, and a distortion characteristic deteriorates.

According to the high frequency power amplifier according to the first embodiment of the present invention shown in FIG. 6, the impedance conversion circuits 2a, 2b, 2c and 2d as diode bias circuits are provided for the respective transistor blocks 1a, 1b, 1c and 1d, and the transistors 11a, 11b, 11c and 11d as impedance conversion portions and the temperature sensing diodes 6a, 6b, 6c and 6d as diode portions are arranged closely to the corresponding transistor blocks 1a, 1b, 1c and 1d. With such constitution, even if variation in the device temperature occurs among the transistor blocks 1a, 1b, 1c and 1d, the bias points of the transistor blocks are fixed to either the B class or the AB class, and hence power efficiency is improved.

Since outputs from the bias circuits 2a to 2d are supplied to the high output transistors with low impedance owing to the emitter followers 11a to 11d, the fluctuation of the base potential due to the change of the envelope line of the modulation signal is strongly suppressed. Accordingly, the high frequency amplifier of the present invention shown in FIG. 6 is expected to show a low distortion characteristic suitable for the digital modulation method.

Furthermore, in the table shown in FIG. 10, the efficiency of the bipolar transistors, which are respectively shown in FIG. 6 and FIG. 7, for the wide band CDMA signal of 2 GHz is shown. In the conventional bipolar transistors whose constitution is shown in FIGS. 1 and 2 and whose characteristic is shown in FIG. 3, when the emitter resistance per finger is decreased from 3.5 Ω to 2 Ω, the current distribution becomes uneven, so that the efficiency is largely deteriorated from 35% to 27%.

On the other hand, according to the bipolar transistor according to the first embodiment of the present invention, even when the emitter resistance per finger is decreased from 3.5 Ω to 2 Ω, the uniformity of the current distribution can be kept. Therefore, the deterioration of the efficiency does not occur. On the contrary, since a decrease in a saturation voltage and an upper limitation of transmission conductance are removed, the efficiency is increased. Although the efficiency is 38% when the emitter resistance per finger is 3.5 Ω, the efficiency is improved to 43% when the emitter resistance is 2 Ω.

Moreover, the improvement in a breakdown resistance in the circuit is recognized as an additional effect. When high frequency power that is too excessive is input to the bipolar transistors in which many fingers are in parallel connected to each other, so called a current concentration in which all powers concentrate to one finger occurs. A temperature of the emitter finger where the current concentration occurs becomes very high, leading to a device breakdown in many cases. In the circuit of the conventional high frequency power amplifier as shown in FIG. 1, the DC bias is bound to one point, and thereafter distributed to each finger.

Therefore, the bias circuit possesses an ability to supply the base current to all fingers sufficiently. As a result, in the case where the current concentration occurs among the fingers of the high output transistors, the sufficient base current is supplied to one finger where the current concentration occurs, and hence all high frequency powers are concentrated on one finger. Thus, the device is easily broken.

Figure 4:
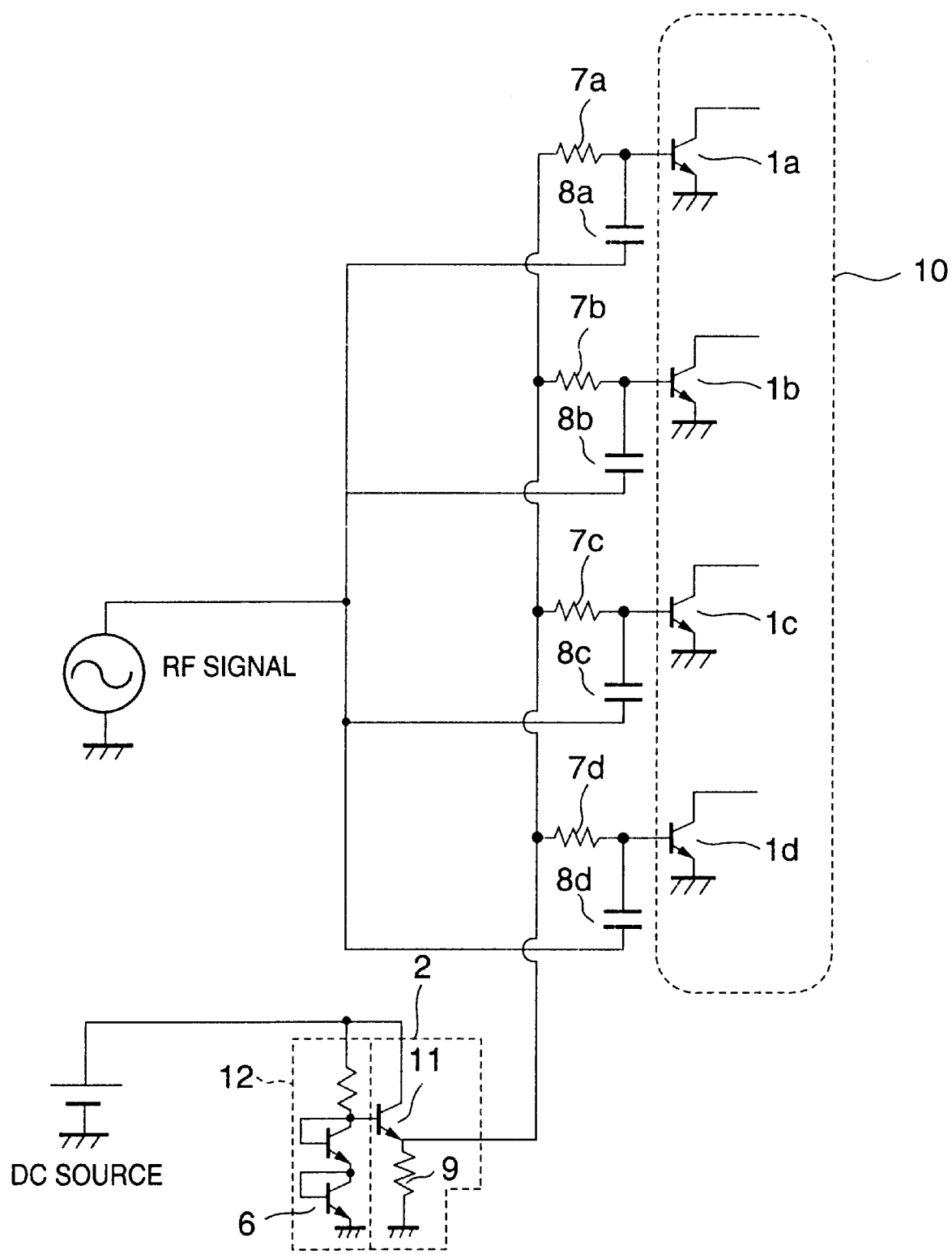
FIG. 4 is a circuit diagram showing a high frequency power amplifier using bipolar transistors according to a conventional second example.
Figure 5:
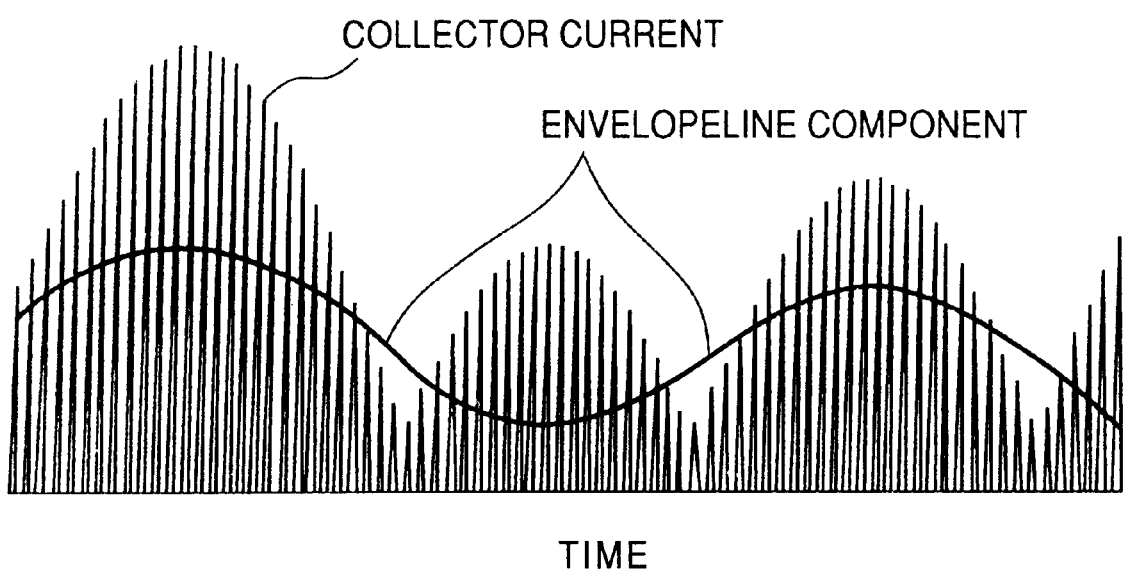
FIG. 5 is a characteristic view schematically showing an envelope component and a collector current of the bipolar transistor in the conventional high frequency power amplifier.

In the circuit of the conventional high frequency power amplifier shown in FIG. 4, the resistances 7a, 7b, 7c and 7d for preventing the high frequency power from flowing to the bias circuit are connected in series to the respective transistor blocks 1a, 1b, 1c and 1d or the respective fingers, and serve as the ballast resistances. Therefore, a threshold, at which the current concentration occurs, increases. However, once the current concentration occurs, the bias current can supply a large base current to one finger in which the current concentration occurs, so that the device is broken.

On the other hand, according to the high frequency power amplifier according to the first embodiment of the present invention, since the plurality of bias circuits are provided, the ability of each bias circuit to supply the current is lessened by the number of division compared to the conventional circuit. Therefore, even if the bipolar transistor is subjected to an extreme bias condition where the current concentration occurs, the base current supplied to the finger where the current concentration occurs can be set to a level in which the device is not broken.

Next, the embodiment of the present invention will be studied while comparing the current of the transistor 11 of the bias circuit 2 with the conventional example. In the foregoing first conventional example shown in FIG. 1, a linear output of 30 dBmW is obtained with a power voltage of 3.6 V under normal load conditions. At this time, since the current gains of the transistor blocks 1a, 1b, 1c and 1d are equal to about 100, the sum of the base currents of the transistor blocks 1a, 1b, 1c and 1d is equal to about 4.5 mA. Since the bias current at a normal state is actually about 1.5 mA, the current flowing through the transistor 11 is 6 mA.

In application to the mobile telephones, load impedance of the power amplifier sometimes changes largely in accordance with the state of an output antenna. When the load impedance is made to be small, the collector currents of the transistor blocks 1a, 1b, 1c and 1d increase to 2000 mA or more. At this time, the current gains of the transistor blocks 1a, 1b, 1c and 1d decrease to 50, and the current of the transistor 11 of the bias current 2 reaches to as mush as 40 mA or more. Therefore, the transistor 11 causes the thermal runaway to be broken, and the conventional circuit shown in FIG. 1 falls into operational malfunction as the high frequency power amplifier. A mechanism of this breakdown occurs also in the circuit of FIG. 4 similarly.

On the other hand, in the first embodiment of the present invention shown in FIG. 6, when the collector currents of the transistor blocks 1a, 1b, 1c and 1d reach to 2000 mA or more due to the variation of the external collector load thereof, since the bias circuit is divided and the individual bias circuits are provided for the respective transistor blocks, the currents flowing into the transistors 11a, 11b, 11c and 11d are 10 mA or less, and the breakdown of the bias circuit does not occur.

Figure 11:
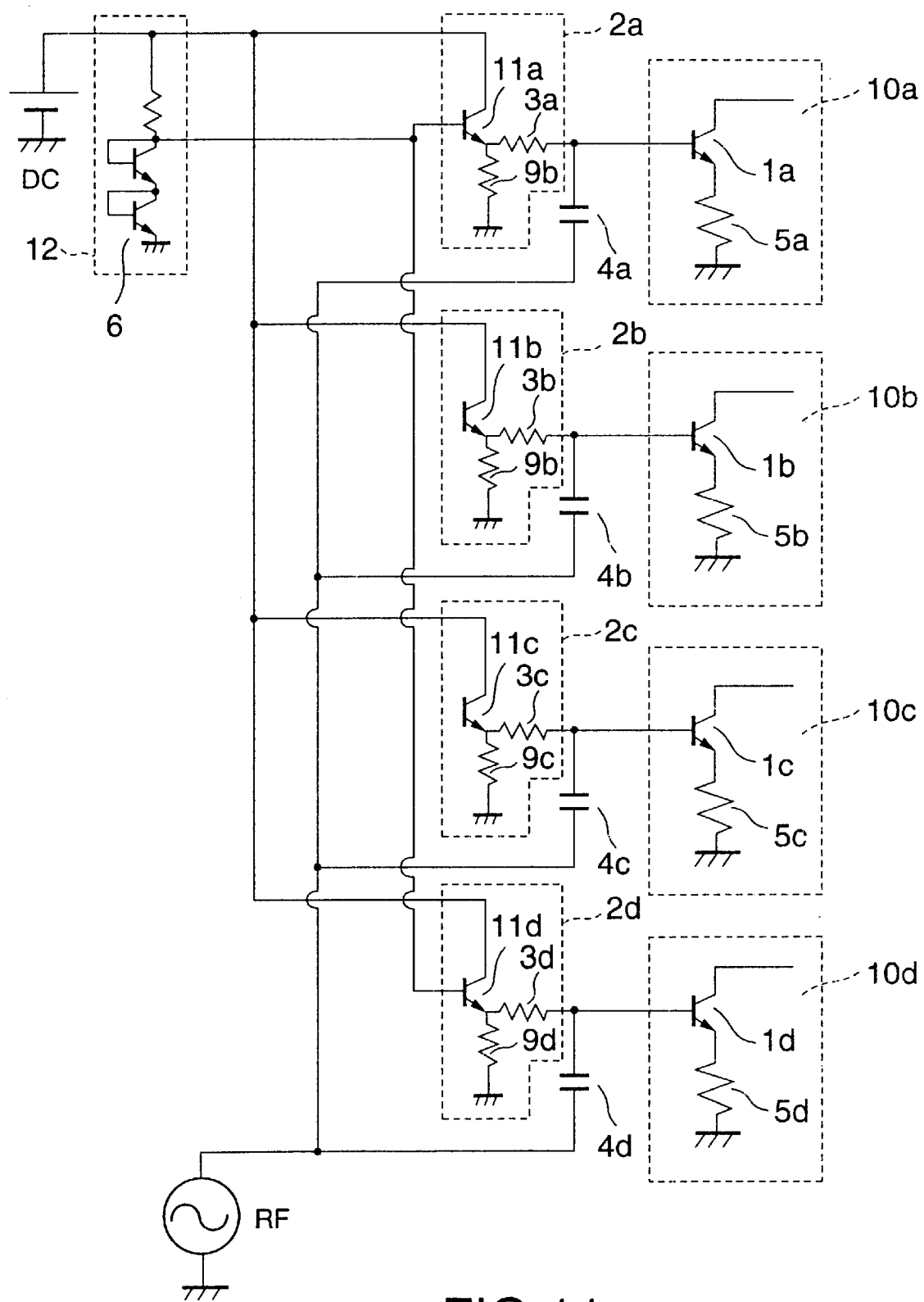
FIG. 11 is a circuit diagram showing a high frequency power amplifier using bipolar transistors according to a second embodiment of the present invention.

FIG. 11 shows a high frequency power amplifier using bipolar transistors according to a second embodiment of the present invention. The reference voltages of the base bias, which are generated by the individual reference voltage generation circuits 12a, 12b, 12c and 12d are supplied to the bases of the impedance conversion transistors 11a, 11b, 11c and 11d of the diode bias circuits 2a, 2b, 2c and 2d in the high frequency power amplifier according to the first embodiment of the present invention of FIG. 6. In the second embodiment shown in FIG. 11, the reference voltage for the base bias is generated by the common reference voltage generation circuit 12, and supplied to the bases of the transistors 11a, 11b, 11c and 11d. The reference voltage generation circuit 12 comprises a diode circuit 6, which is subjected to constant current biasing.

According to the constitution shown in FIG. 11, the bias voltage determined by the reference voltage generation circuit 12 composed of the diode circuit 6, which generates the reference voltage for one base bias, is supplied to the respective bases of the impedance conversion transistors 11a, 11b, 11c and 11d of the plurality of the diode bias circuits 2a, 2b, 2c and 2d. And then, the base bias voltages are supplied from the impedance conversion transistors 11a, 11b, 11c and 11d to the respective transistor blocks 1a, 1b, 1c and 1d for performing the high frequency power amplification.

Figure 12:
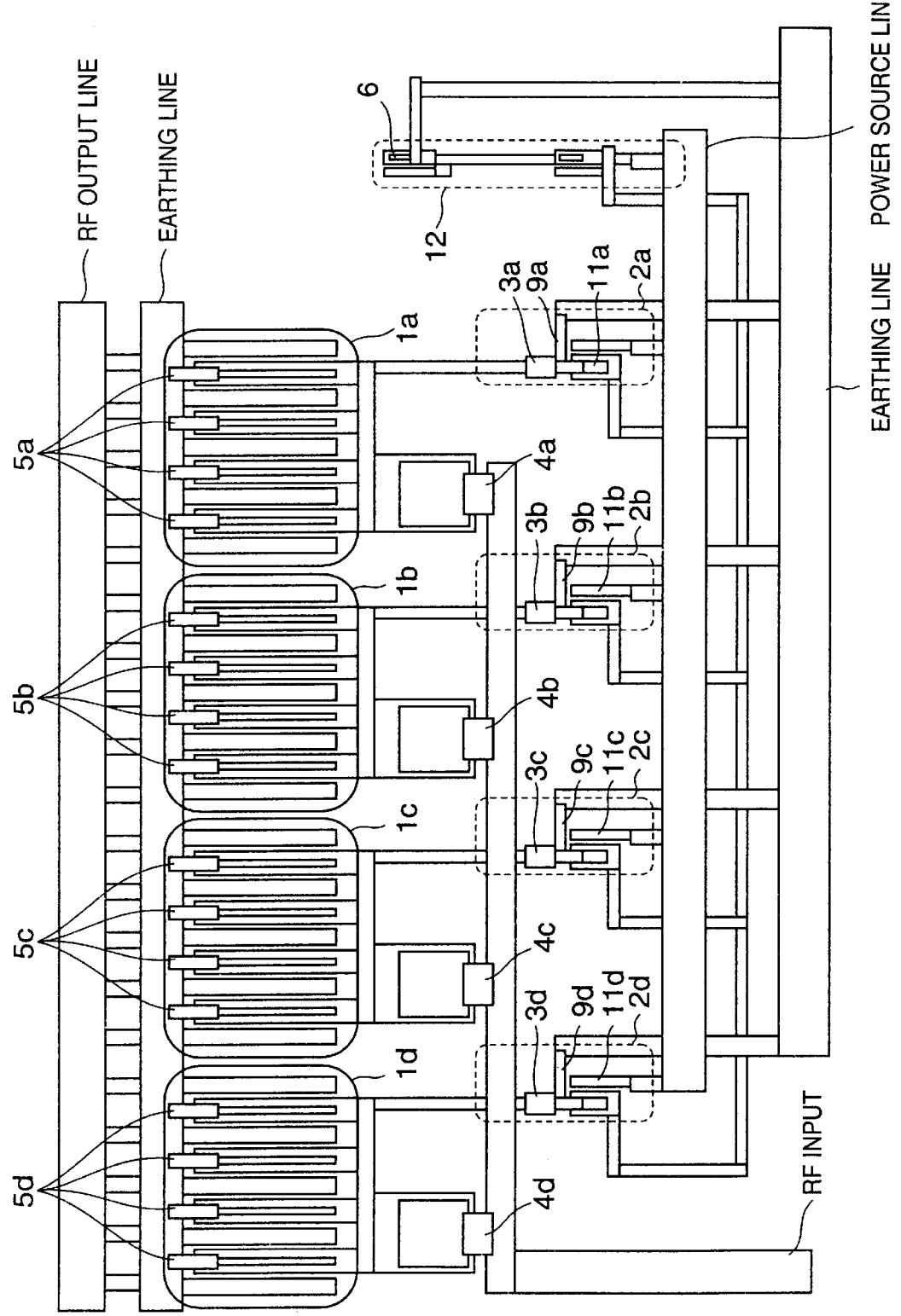
FIG. 12 is a plan view showing a pattern layout of the high frequency power amplifier according to the second embodiment of the present invention.

FIG. 12 is a plan view showing a pattern layout of the high frequency power amplifier shown in FIG. 11. The same reference numerals as those given to the constituent portions provided in the circuit diagram of FIG. 11 are given to the constituent portions of FIG. 12. Accordingly, the same reference numerals in both diagrams of FIGS. 11 and 12 show the same constituent components, and repetitive descriptions for them are omitted. Similarly to the high frequency power amplifier according to the first embodiment shown in FIGS. 6 and 7, the high frequency power amplifier according to the second embodiment shown in FIGS. 11 and 12 can significantly improve the resistance to the breakdown of the bias circuit, compared to the prior arts.

Specifically, even when the collector loads of the transistor blocks 1a, 1b, 1c and 1d constituting the high frequency power amplifier fluctuate, the collector currents thereof increase and the base currents thereof increase, the current concentration does not occur and resistance to the breakdown increases because the transistors 11a, 11b, 11c and 11d for performing the impedance conversion of the bias circuits are provided individually for the respective transistor blocks 1a, 1b, 1c and 1d.

As to the high frequency power amplifier using the bipolar transistors according to the second embodiment shown in FIG. 11, the descriptions were made for the one, in which the impedance conversion circuits 2a, 2b, 2c and 2d are constituted of the transistors 11a, 11b, 11c and 11d and the resistances connected to the emitters of the respective transistors 11a, 11b, 11c and 11d. However, the present invention is not limited to this, and a high frequency power amplifier, in which the impedance conversion circuits 2a, 2b, 2c and 2d have no resistances on the emitter sides of the respective transistors, may be adopted.

Figure 13:
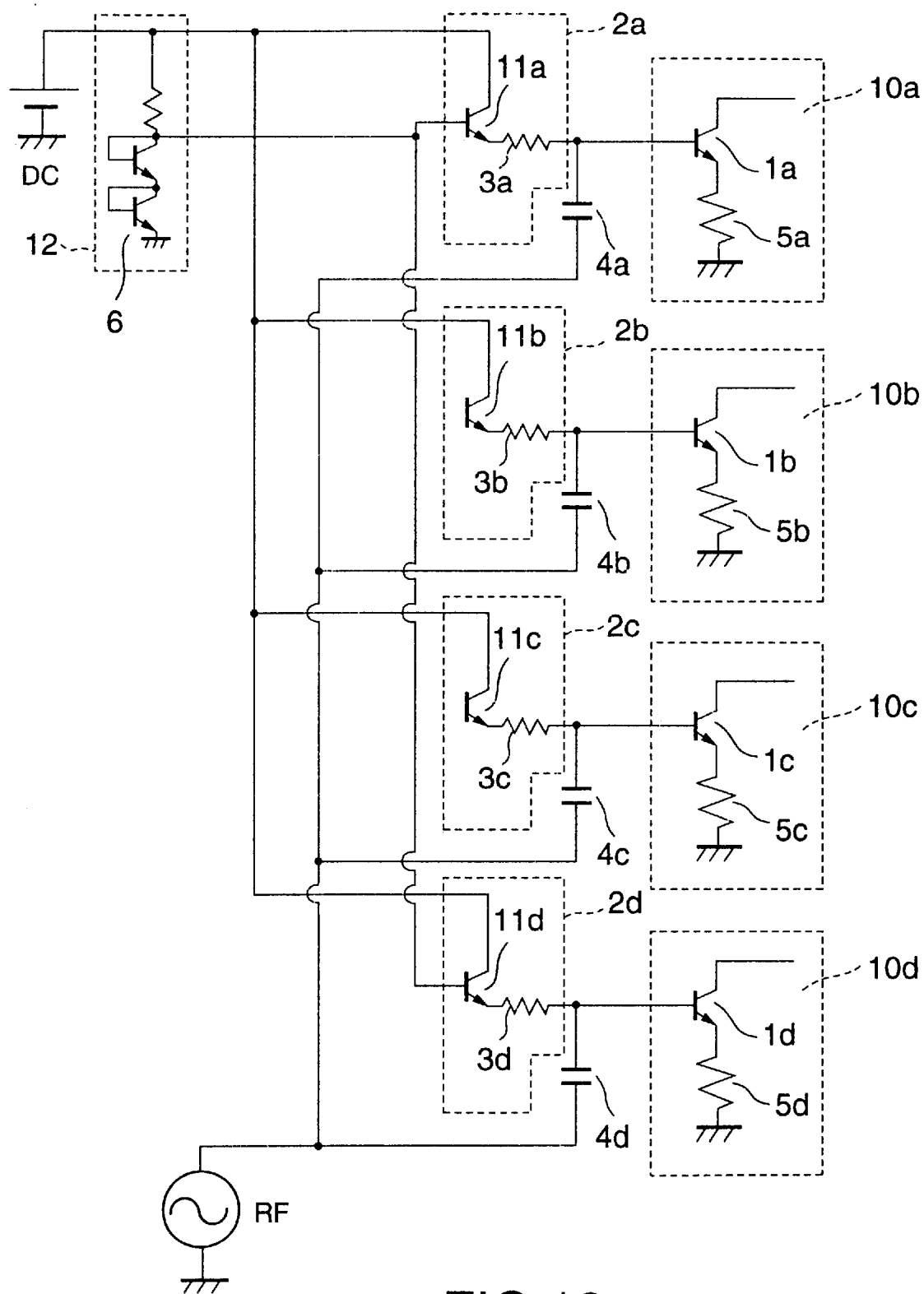
FIG. 13 is a circuit diagram showing a high frequency power amplifier using bipolar transistors according to a third embodiment of the present invention.

FIG. 13 is a circuit diagram showing a high frequency power amplifier using bipolar transistors according to a third embodiment of the present invention. In FIG. 13, the bias circuits 2a, 2b, 2c and 2d are respectively constituted only of impedance conversion transistors 11a, 11b, 11c and 11d having an emitter follower constitution. The present invention can be constituted as the circuit of the third embodiment shown in FIG. 13, and the current concentration does not occur with such constitution, even when the collector current increases due to the fluctuation of the collector load and the base current increases. Thus, the breakdown resistance is improved.

Figure 14:
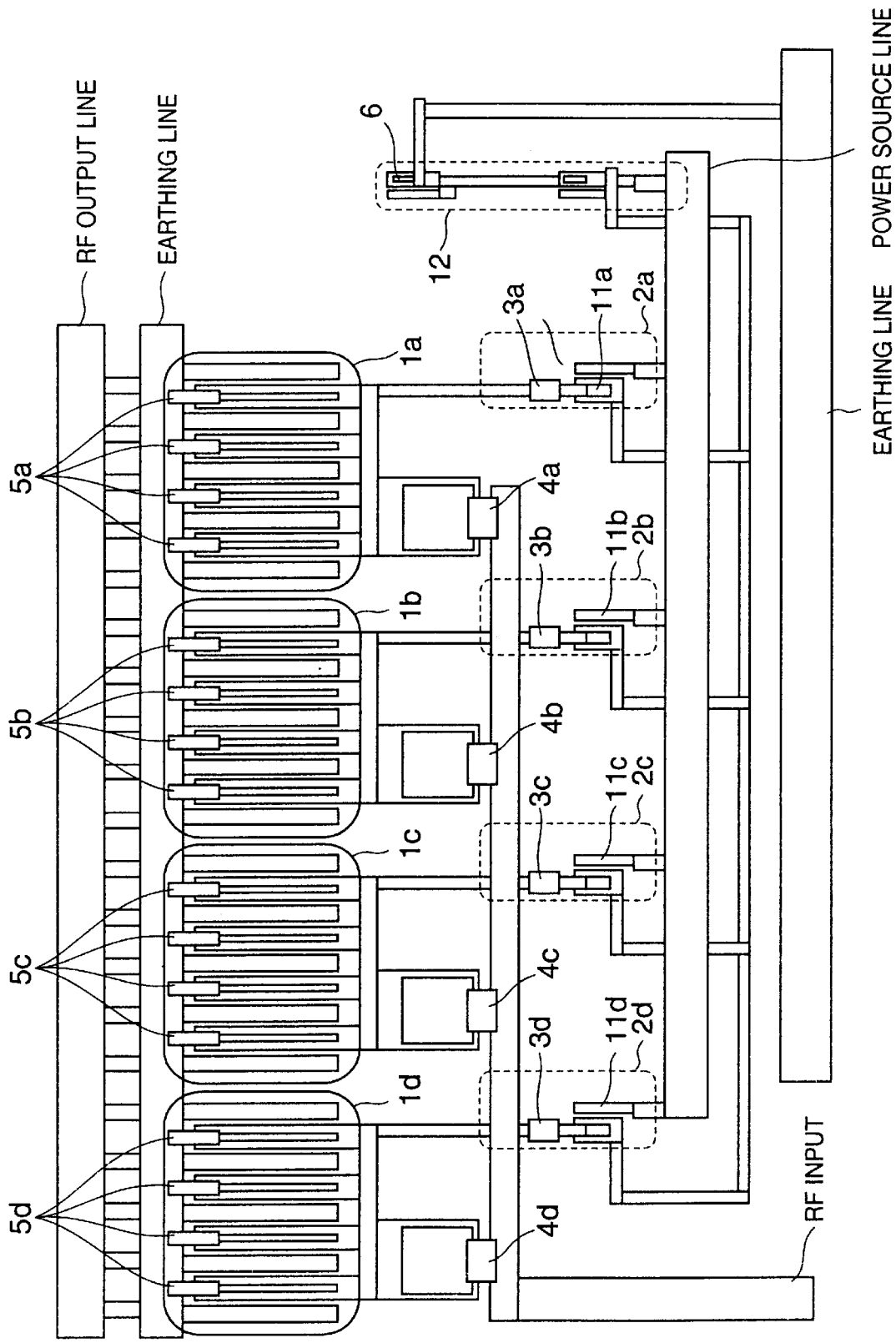
FIG. 14 is a plan view showing a pattern layout of the high frequency power amplifier according to the third embodiment of the present invention.

Also the high frequency power amplifier according to the third embodiment can be constituted by the pattern layout as shown in FIG. 14. Also in the plan view of FIG. 14, the constituent components with the same reference numerals as those of FIG. 13 correspond to those in the circuit diagram of FIG. 13.

In the first, second and third embodiments described in the foregoing specification, the descriptions were made for the high frequency power amplifier in which the number of the transistor blocks are four. However, the present invention is not limited to this, and it is natural that the present invention can be applied to a high frequency power amplifier having the n($n \geq 2$) transistor blocks.

Furthermore, as the embodiment of the bias circuit, exemplified was the system in which the reference potential generated by the diode circuit undergoes the impedance conversion to be supplied to the high frequency transistor. However, when so called a current mirror circuit, in which a negative feedback loop is provided between the reference voltage generated by the diode circuit and the output potential obtained by the impedance conversion, is adopted, the same effects as those in the embodiments having the foregoing constitutions can be obtained, and the subjects of the present invention can be solved.

The bipolar transistor excellent in the uniformity of the current distribution can be provided even when the ballast resistance is made to be small. When the bipolar transistor is applied to a high frequency power amplifier, it is possible to provide the amplifier showing high efficiency and low distortion with little deterioration of distortion even when a digital modulation wave showing a large change of an envelope line is input thereto.

While there has been illustrated and described what are presently considered to be preferred embodiments of the present invention, it will be understood by those skilled in the art that various changes and modifications may be made, and equivalents mat be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed but that the invention includes all embodiments falling within the scope of the appended claims.

What is claimed is as new and desired to be secured by Letters Patent of the United States is:

1. A high frequency power amplifier, comprising:

a plurality of transistor blocks in a monolithic integrated circuit, each of said transistor blocks having a bipolar transistor, wherein each of said transistor blocks further comprises:

a reference voltage generation circuit configured to generate a reference voltage as a base bias of said bipolar transistor independently in accordance with a temperature in each of said transistor blocks;

a bias generation circuit connected to a base of said bipolar transistor, said bias generation circuit generating a base bias voltage by converting said reference voltage; and a capacitor device for a high frequency input, said capacitor device being connected to the base of said bipolar transistor.

2. The high frequency power amplifier according to claim 1, wherein each of said transistor blocks further comprises a resistance connected to an emitter of said bipolar transistor.

3. The high frequency power amplifier according to claim 1, wherein said bias generation circuit further comprises constituent components including a resistance provided between a circuit configured to convert said reference voltage as the base bias of said bipolar transistor to low impedance and a base terminal of said bipolar transistor, the base terminal being provided for preventing a high frequency.

4. The high frequency power amplifier according to claim 1, wherein said bias generation circuit further comprises constituent components including:

a second bipolar transistor having a base connected to the reference voltage of the base bias and a collector connected to a DC power source; and a resistance provided between an emitter of said second bipolar transistor and the base terminal of said bipolar transistor, the resistance being provided for preventing a high frequency.

5. The high frequency power amplifier according to claim 1,
wherein said reference voltage generation circuit has a diode subjected to constant current biasing, and supplies a base bias voltage to each of said transistor blocks in accordance with a temperature change.

6. The high frequency power amplifier according to claim 1,
wherein a diode subjected to constant current biasing is adjacent to said bipolar transistor.

7. The high frequency power amplifier according to claim 4,
wherein said capacitor device for the high frequency input includes a metal insulator metal capacitor device connected to a connection node of the base terminal of said bipolar transistor and said resistance.

8. The high frequency power amplifier according to claim 7,
wherein said metal insulator metal capacitor device is connected to a high frequency power source.

9. The high frequency power amplifier according to claim 1,
wherein said bias generation circuit composed of an emitter follower circuit is provided in each of said transistor blocks, and the reference voltage as the base bias is supplied to a base input of the emitter follower circuit.

10. A high frequency power amplifier, comprising:
a plurality of transistor blocks in a monolithic integrated circuit, each of said transistor blocks having a bipolar transistor; and
a reference voltage generation circuit configured to generate a reference voltage as a base bias of said bipolar transistor independently in accordance with a temperature in each of said transistor blocks,
wherein each of said transistor blocks further comprises:
a bias generation circuit connected to a base of said bipolar transistor, said bias generation circuit generating a base bias voltage by converting said reference voltage; and
a capacitor device for a high frequency input, said capacitor device being connected to the base of said bipolar transistor, and
wherein said bias generation circuit composed of an emitter follower circuit is provided in each of said transistor blocks, and the reference voltage as the base bias is supplied to a base input of the emitter follower circuit.

11. The high frequency power amplifier according to claim 10,
wherein each of said bipolar transistor blocks further comprises a resistance connected to an emitter of said bipolar transistor.

12. The high frequency power amplifier according to claim 10,
wherein said bias generation circuit further comprises:
a second bipolar transistor having a base connected to the reference voltage as the base bias and a collector connected to a DC power source; and
a resistance provided between the emitter of said second bipolar transistor and the base terminal of said bipolar transistor, said resistance being provided for preventing a high frequency.

13. The high frequency power amplifier according to claim 10,
wherein said reference voltage generation circuit includes a diode subjected to constant current biasing, and supplies a base bias voltage to each of said transistor blocks in accordance with a temperature change.

14. The high frequency power amplifier according to claim 10,
wherein a diode subjected to the constant current biasing is adjacent to said bipolar transistor.

15. The high frequency power amplifier according to claim 12,
wherein said capacitor device for the high frequency input includes a metal insulator metal capacitor device connected to a connection node of the base terminal of said bipolar transistor and said resistance.

16. The high frequency power amplifier according to claim 15,
wherein said metal insulator metal capacitor device is connected to a high frequency power source.

17. A high frequency power amplifier, comprising:
a plurality of transistor blocks in a monolithic integrated circuit, each of the transistor blocks comprising:
a first bipolar transistor;
a capacitor, for a high frequency input, connected to the base terminal of the first bipolar transistor; and
an emitter follower circuit configured to supply a base bias voltage to a base terminal of the first bipolar transistor,
wherein the emitter follower circuit in each of the transistor blocks comprises:
a second bipolar transistor having a base terminal and a collector terminal both connected to a DC power source, and having an emitter terminal connected to a ground;
a third bipolar transistor having a base terminal connected to both the base terminal and the collector terminal of the second bipolar transistor, and having a collector terminal connected to the DC power source; and
a resistance connected between an emitter terminal of the third bipolar transistor and the base terminal of the first bipolar transistor.

18. A high frequency power amplifier according to claim 17, wherein the emitter follower circuit in each of the transistor blocks independently supplies a base bias voltage to the base terminal of the first bipolar transistor in accordance with a temperature in each of the transistor blocks.

* * * * *